United States Patent [19]
Curtis et al.

[11] Patent Number: 5,812,288
[45] Date of Patent: Sep. 22, 1998

[54] HOLOGRAPHIC STORAGE OF DIGITAL DATA

[75] Inventors: Kevin Curtis, Summit; Clifford Eric Martin, Martinsville; Thomas J. Richardson, South Orange; Michael C. Tackitt, Califon; Peter M. Winkler, Madison, all of N.J.

[73] Assignee: Lucent Technologies Inc., Murray Hill, N.J.

[21] Appl. No.: 579,524

[22] Filed: Dec. 27, 1995

[51] Int. Cl.$^6$ .............................. G06F 11/00; G11C 7/00
[52] U.S. Cl. .............................. 359/21; 341/81; 341/100; 365/216; 371/2.1; 371/38.1; 371/39.1
[58] Field of Search ..................... 359/107, 21; 365/125, 365/216; 341/81, 100, 13; 395/484; 364/249.4, 249.5; 371/2.1, 38.1, 39.1

[56] References Cited

U.S. PATENT DOCUMENTS

| 3,871,740 | 3/1975 | Matsubara et al. | 365/125 |
|---|---|---|---|
| 4,074,212 | 2/1978 | Hamming et al. | 333/70 |
| 4,394,642 | 7/1983 | Currie et al. | 340/347 |
| 5,450,218 | 9/1995 | Heanue et al. | 365/125 |
| 5,510,912 | 4/1996 | Blaum et al. | 359/107 |
| 5,550,779 | 8/1996 | Burr et al. | 365/216 |

FOREIGN PATENT DOCUMENTS

| 52-36436 | 3/1977 | Japan | 365/125 |
|---|---|---|---|

OTHER PUBLICATIONS

D. Psaltis, et al., "Holographic Memories," *Scientific American*, Nov. 1995, pp. 70–76.

A. Pu, et al., "Shift Multiplexed Holographic 3–D Disk", 1995 OSA Conf. on Optical Computing, *OSA Technical Digest Series*, vol. 10, pp. 219–221.

Hornbeck, L.J., "Deformable–Mirror Spatial Light Modulators", *Proc. SPIE, Spatial Light Modulators and Applications III*, vol. 1150, pp. 1–17, Aug. 1989.

Marchant, Alan, *Optical Recording: A Technical Overview*, Addison–Wesley, pp. 295–300 Oct. 14, 1997.

MacWilliams, F.J., et al., *The Theory of Error–Correcting Codes*, North–Holland Pub. Co., Amsterdam, pp. 567–595 (1977).

*Primary Examiner*—Paul M. Dzierzynski
*Assistant Examiner*—John Juba, Jr.
*Attorney, Agent, or Firm*—George S. Indig

[57] ABSTRACT

Bit error rate in holographic storage/reconstruction is reduced by 2-dimensionally dispersing symbols constituting codewords so that no two codeword-common symbols occupy a single row or column on the SLM display.

14 Claims, 1 Drawing Sheet

HOLOGRAPHIC STORAGE OF DIGITAL DATA

TECHNICAL FIELD

Holography.

DESCRIPTION OF RELATED ART

*Scientific American,* Nov. 1995, at p. 70, discusses holography and its promise for information storage. The article first reviews the importance of optical storage, stressing the role of the compact disc in video and in computing—the present storage capability of the CD-ROM is 640 Mbytes, and it is expected to increase by an order of magnitude on the basis of work in progress. The article then discusses the orders-of-magnitude further improvement offered by holographic recording.

Highest densities require multiplexing. Multiplexing may depend: on angle of incidence of the reference beam on the recording medium; on wavelength; on phase. All have been proposed for recording successive holographic "pages" in a specified region of recording medium.

An article in 1995 *OSA Conf. on Optical Computing, OSA Technical Digest Series,* vol. 10, pp. 219–221, describes a variant. That process, "shift holography" depends on partially overlapping holograms produced by shifting the recording medium relative to the signal and reference beams between exposures/pages. Postulated densities are ~100 bits/$\mu m^2$ using 8 mm thick crystals of iron-doped $LiNbO_3$. Truly a volume holographic technique, recording density is significantly less for thin media.

A method described in co-pending U.S. Pat. App. Ser. No. 08/435,705, filed May 5, 1995, hereby incorporated by reference, permits use of thin recording media-thicknesses typically 1 mm and less—while retaining storage densities of shift holography. That method, "Phase Correlation Multiplex Holography" (PCMH), substitutes phase correlation for Bragg angle as the means for differentiating successive partial overlapping holograms. Illustratively, a binary random phase mask of 1 $\mu m$ pixel pitch is positioned next to the recording medium, is spatially filtered and the mask together with the medium is then shifted relative to the beams so that each hologram "sees" a different phase and intensity pattern for successive pages. Densities of hundreds of bits/$\mu m^2$ for shift distances of a few $\mu m$ have been attained.

Holographic multiplexing systems typically depend on data introduction by means of a spatial light modulator (SLM). Serving to avoid delay time needed for changing fixed transparencies, the SLM is an electronically-addressable pixel array in which pixel state is dictated by locally-altering transmission or reflectivity. The pixel-represented information is then imposed on an incident light beam which, as modulated, becomes the signal beam. Interference between this signal beam and the reference beam within the recording medium produces a hologram. SLMs may operate by various principles: e.g. by altering refractive index to change phase (to result in selective destructive interference); by use of a liquid crystal array in conjunction with a polarizer (in transmissive or reflective mode); by changing reflectance with a deformable mirror array. See, Hornbeck, L. J., "Deformable-Mirror Spatial Light Modulators", *Proc. of SPIE,* Spatial Light Modulators and Applications III, vol. 1150, pp. 1–17, August 1989.

It is expected that PCMH, will speed the transition from $LiNbO_3$ to thin film polymeric recording media. Photo-induced refraction in such film media is due to simple photo-induced polymerization which is easily tailored to meet requirements. Polymers are less costly and do not share $LiNbO_3$ disadvantages: need for post-fixing, low sensitivity, and danger of optical damage during readout.

Limitations on density due to signal-to-noise ratio (SNR), related e.g., to material characteristics and their relationship to page density, are believed well understood. SLM/detector defects introduced either in manufacture or in operation are generally analogous to those in other technologies using arrays. U.S. App. Pat. Ser. No. 08/579,525, filed Dec. 27, 1995 claims a remedy suitable for improving error tolerance in PCMH and other contemplated holographic storage/retrieval procedures. That remedy scatters bits constituting partitioned groups in order to statistically reduce the likelihood of related bits being corrupted by a single point defect.

Co-filed U.S. Pat. App. Ser. No. 08/579,497, filed Dec. 27, 1995, hereby incorporated by reference, is based on the finding that the holographic process is subject to a previously unobserved phenomenon—error rate is found to increase for increasing run-lengths of same-state pixels. Claims in that application address the phenomenon and reduce the total number of error bits by methods that deterministically or probabilistically limit same-state pixel run-length.

Error-correction coding is at a sophisticated level of development. Historically significant Hamming coding, U.S. Pat. No. 4,074,212 issued Feb. 14, 1978, is regarded as the onset of a host of developments which, disregarding overhead, offers unrestricted capability for correcting error bits. Present practice is exemplified by Reed-Solomon coding, sometimes in multiple levels. See, Alan Marchant, *Optical Recording: A Technical Overview,* Addison-Wesley, pp. 295–300 (1990).

TERMINOLOGY

Bit - Element in a one-dimensional information stream. Bits exist in either of the two digital states - "1's" and "0's". The term is applied to either digital state. The designations are not intended to signify which of the states is of higher energy. Particularly relevant bit streams are those constituting "input data" (prior to an SLM) and "output data" (as produced by detector electronics).

Pixel - Information-bearing element in a two-dimensional array representative of bit population. Where representative of a single bit, or where multiple pixels represent a single bit, the pixel, like the bit, may be in either of two states - "on" or "off". Where representative of two or more bits, the pixel may be in an intermediate (gray) state. If not otherwise indicated, the term is generic to pixels in any permitted state.

Input Data - One-dimensional bit stream, subsequently processed to yield pixels which constitute "arrayed data".

Arrayed Data - Processed input data, converted to two-dimensional form, suitable for use in the two-dimensional array adapted for modulating incident light and for producing the signal beam. It may be further processed by the SLM drive electronics to place it in proper form for display, e.g. by D to A conversion as required for gray-scale pixels.

SLM - Spatial light modulator - constituted of a pixel array which, as modulated by information in the input data, displays "arrayed data".

Error Correction Coding (ECC) - Procedure whereby data bit groups, produced by partitioning of a bit stream, are encoded by insertion of parity bits which, during decoding, serve to correct error bits.

Codeword - Data bit group together with parity bits allocated to that group.

BER - Bit error rate or the number of erroneous bits expressed as a fraction of the total number of bits.

Raw BER - This is the BER before any error correction decoding, i.e., BER as measured without ECC decoding. (The term applies whether or not there has been ECC encoding and whether or not there has been scrambling, compression, or other encoding/decoding.)

Net BER - BER after ECC decoding.

Symbol - Generalized term used for individual bits or groups of bits, e.g, bytes (ordinarily constituted of 8 bits/byte).

Row - Pixels defining a scan line or address line of pixels, e.g. as displayed on an SLM or on a detector. Where addressing is bi-directional, the "row" defines an arbitrarily chosen first address line.

Column - Pixels defining a line at an angle to a row. In usually contemplated displays, columns are address lines which are orthogonal to rows.

ECC Overhead - Bits inserted into a data bit stream by ECC, ordinarily expressed as the fraction of parity bits+ detection bits in the numerator and total bits (parity bits+ detection bits+data bits) in the denominator—for convenience of calculation, that fraction as measured within a single codeword.

Codeword-Common Symbols or "Common Symbols"- Symbols constituting a particular codeword. The term includes parity symbols as well as data symbols.

SUMMARY OF THE INVENTION

An additional phenomenon leading to non-uniform distribution of error bits has been found to limit performance in holographic recording and detection. It is found that error bits tend to locate in "bursts" linearly extending well beyond the influence of "point defects", e.g., mechanical defects in the SLM or detector introduced during manufacture or in use. These bursts extend over major fractions or even over entire rows or columns.

The invention addresses this phenomenon by "2D Codeword Dispersal", designed to limit the number of codeword-common symbols on any particular row or column. The major impact of dispersal is to distribute error bits more uniformly—thereby improving effectiveness of ECC. Since, in principle, bursts of error bits may be corrected by increased ECC—either by more complex coding or by iteration with successive levels of coding—the invention should be viewed as expediting, rather than enabling. The advance may be used to reduce ECC overhead for a prescribed value of net BER.

Under most circumstances, most effective 2D dispersal limits codeword-common symbols population to one bit per row or column. Encoding for attaining this distribution is generally feasible, so that it is regarded as a preferred embodiment. Under some circumstances, depending on codeword length and correction power, ultimate dispersal is not justified, and expediency/cost are best served with a lesser degree of dispersal.

The advance is measured in terms of net BER improvement resulting from introduction of 2D codeword dispersal into an encoding process which is otherwise unchanged. Improvement by a factor of at least 2 is experimentally observed under test conditions considered representative of conditions likely to be encountered in practice.

DETAILED DESCRIPTION

General

The invention is regarded as a means for effectuating error-correction coding. ECC is initiated by partitioning the data stream into groups of bits. Parity bits, together with data bit groups constitute codewords. (For example, state-of-the-art Reed-Solomon coding may be directed to "122,106" codewords, meaning a codeword is constituted of 106 group data symbols out of a total of 122 codeword symbols including parity symbols.) Properly designed ECC produces codewords with capability for correcting one error symbol for every pair of parity symbols.

ECC effectiveness requires that two conditions be met: 1) the error rate must be reasonably low, and 2) errors must be substantially "independent"- i.e., errors must be sufficiently separated so that error symbol population in a single codeword does not exceed correcting ability.

The invention addresses the second requirement. It is designed to break up clumps or "bursts" of error symbols in a two-dimensional array. An analogous one-dimensional phenomenon is addressed by "Interleaving ECC" which scatters symbols of a codeword linearly within the codeword. See, Alan Marchant, Optical Recording: A Technical Overview, cited above. Its effect in direction orthogonal to scan lines is minimal—of possible measurable consequence for a column distance of two bits where a codeword wraps around the end of a row.

Point defects, generally produced during manufacture, but possibly introduced by lightning strike or other calamity in use, is regarded as having a range of influence restricted to a 5×5 array centered about the defect. The influence of such a point defect may be addressed by permuting a codeword so that its constituent bits, still on the original row or column, are separated by a distance which exceeds that range of influence.

Dispersal algorithms, in accordance with the invention reduce common-symbol occupancy of a particular row or column over distances of at least 10 bits with preferred embodiments addressing codeword lengths—commonly 122 bits or greater.

The advance lies primarily in recognition and significance of the phenomenon. Algorithmic solutions, set forth or referenced, are illustrative of those that would be constructed by the artisan after having been advised of the advance.

Examples 1 and 2 compare illustrative procedures which are with encoding-decoding, identical but for 2D Codeword Dispersal. The advance under the conditions of the examples was a reduction of about 70% in net BER. It is estimated that 2D Codeword Dispersal could have been used for reduction in ECC overhead by about 5% for attainment of the net BER of Example 1. Attainment of ECC overhead reduction of $\geq 1\%$ (or a reduction in net BER $\geq 10\%$) is already a worthwhile goal and is generally attainable by 2D Codeword Dispersal.

Figure 1:
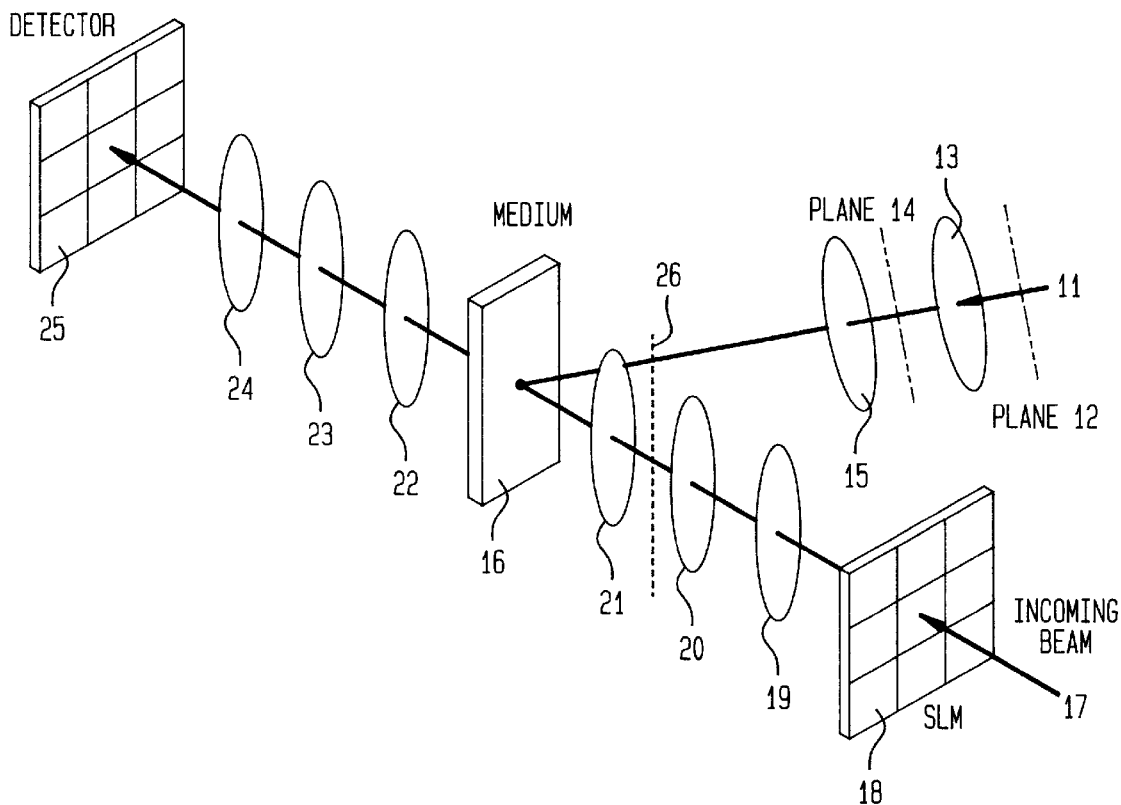
FIG. 1 is a copy of FIG. 1 of co-pending U.S. application Ser. No. 08/435,705, schematically depicting apparatus and processing useful in the PCMH of that application. Discussion of a more general class of multiplex holography suitable for practice of the present invention is based on this figure.

The System - FIG. 1 shows incoming beam 11 which will serve as a reference beam. Considering the system for PCMH (co-pending U.S. Pat. application Ser. No. 08/435,705), the incoming beam is converted into a phase beam by a phase mask located on plane 12. It next passes through lens 13; is spatially filtered by a filter on plane 14; passes through lens 15 and strikes recording medium 16. With lenses 13 and 15 in 4F configuration, the mask is imaged on medium 16. Spatial filtering is effectively carried out on a Fourier plane 14 (with plane 14 on the Fourier plane for the lens pair). Magnification of the mask image is determined by the focal lengths of the lenses. One set of experiments in this co-pending application used a random binary phase mask constituted of a 1024×1024 array of 20 µm pitch pixels. In this illustration, half of the randomly located pixels impose a phase-shift of 180° so that the average phase across the beam front is zero.

A second incoming beam 17 is modulated by spatial light modulator (SLM) 18. The resulting signal beam is routed through lenses 19, 20, and 21. Corresponding lenses 22, 23, and 24 are used in readout. With both sets of lenses in 4F configuration, a Fourier transform is recorded in medium 16, and an image is reconstructed on detector 25. (4F configuration requires focal distance spacings so that, e.g. SLM-to-lens spacing is equal to the focal distance of lens 19, lens 24-to-detector spacing is equal to the focal distance of lens 24, and lens-to-lens spacings are the sums of the focal distances of the lenses in the pair). Omitting a single lens in lens set 19, 20, 21 replaces the transform with the image at the medium - omitting a lens in set 22, 23, 24 again results in image reconstruction at the detector.

The specifics of the arrangements of FIG. 1 are illustrative. Omitting the phase mask, lens 13, and the spatial filter at plane 14, and by defocusing the reference beam to obtain sufficient overlap with the signal beam, the system is suitable for "shift holography". The figure is intended to represent other forms of multiplex holography, in which successive pages are completely superimposed in the same region of the medium, as well as single-page holography (without multiplexing).

Variants include lens arrangements for recording or detecting a Fourier transform or an image of the signal with enlargement or reduction, and for additional spatial filtering for improved SNR. Individual plane waves, multiple plane waves, and spherical beams have been used as reference beams in more traditional holography and can be used here as well. The precise position of the phase mask in PCMH, is not critical, but, together with other elements in the reference path, must be in the same position for recording and readout. A phase mask in contact with SLM 18 or at image plane 26 assures uniform brightness of the signal beam for optimal recording. The signal beam may be filtered to eliminate noise or higher-order diffraction modes. 4F spacing may be replaced by other lens arrangements either for imaging or for Fourier transform.

Figure 2:
FIG. 2 is a generalized flow chart for holographic recording and reconstruction.

Data Presentation - The inventive teaching and examples are discussed in conjunction with the FIG. 2 flow chart. The first entry on the chart, input data 30, is a one-dimensional bit stream. It is encoded by ECC and possibly by other means at 41 to result in ECC-encoded data at 42, is rearranged, and modified in accordance with the invention at 31 to form dispersed and arrayed data 32, which is then converted to a suitable form by the SLM drive electronics at 33 (e.g., where there is provision for gray-scale pixels, by D to A conversion), and is introduced to SLM 34. The incident beam is modulated by the arrayed data on the SLM to form a signal beam, and after routing by optics 35, is combined with a reference beam, not shown, so as to yield a hologram in medium 36. During read-out, a read-out beam, not shown, is modulated by the recorded hologram in medium 36; and is passed through optics 37 to produce an image on detector 38. The imaged signal is then converted into digital output data stream 40 by detector electronics 39, thereby replicating input stream 30. (The flow chart does not show ECC nor other process steps conventional in prior art holography.)

In experiments, the incoming bit stream 30 was made up of 7 bit codewords containing 3 ECC bits. See, The Theory of Error-Correcting Codes, cited above. In arraying, the one-dimensional stream was transformed into a matrix, with one codeword bit per line and with 576×416 pixels per page. Each bit was differential encoded with two pixels. For example, a "1" bit was represented by an "on, off" pair of pixels, while a "0" but was represented by an "off, on" pair.

Examples - The experimental system used was of the form of flow chart 2 and consisted of a commercially-available twisted nematic liquid crystal spatial light modulator (34) with a capacity for a 640×480 pixel array of 42 micron pitch pixels. Detector (38) was a CCD of 24 µm pixel pitch. The system provided for gray-scale pixels - the detector converts the incoming analog signal into digital information with 16 bits per pixel resolution. The input data bit stream (30) was produced from a video graphics array (VGA) computer card, and was passed through the system one page at a time.

Example 1 - A file of 667,761 bytes (8 bits per byte) was presented to the system in sequential SLM pages. ECC used Hamming code (7, 4) - i.e. a codeword was of 7-bit length with 4 of the seven being data bits. The data was arrayed by raster scanning without the inventive 2D dispersal. After detecting and decoding, the total number of corrected errors was 955 and the total number of uncorrected errors was 404, resulting in a net BER of $7.56 \times 10^{-05}$.

Example 2 - The procedure of Example 1 was repeated, with a single change—that the array data was 2D dispersed in accordance with:

$x_{incremental}=31$ $y_{incremental}=119$

The arrayed data (576×416) was smaller than the SLM capacity (640×480), leaving a border 32 pixels in width. Incrementing was done eight times in both x and y - for a starting position of (0, 0) –x=0, y=0 - the second sequence was begun at position (0, 1), etc. The addition done in incrementing of both x and y was by mod number of columns and numbers of rows, respectively.

After detecting and decoding, the total number of corrected errors was 1,000 and the total number of uncorrected errors was 123, resulting in a net BER of $2.27 \times 10^{-05}$ (representing an improvement of 3.33 due to 2D dispersal by the outlined procedure). The expected improvement level depends on the precise nature of both the raw BER and the ECC.

Mechanism - The invention is based on the finding that the magnitude of "correlated noise" in both columns and rows is sufficient to meaningfully increase net BER for any given level of ECC. Three possible mechanisms for causing correlated noise are described:

Pixel-to-pixel coupling during addressing of the SLM along rows and columns results in some carryover from position-to-position. It is assumed that address is bi-directional in accordance with usual practice—where address is one-direction, correlated noise due to coupling is also restricted to that one direction. (There may be some additional noise generation between pixels which are in close spatial proximity.)

Since detectors are conventionally read out in rows and/or columns, coupling during readout of the detector results in correlated noise along these rows and/or columns.

During transmission through the optical system, some of the energy of a given pixel is spread into other pixels due to diffraction and optical imperfections. The effect is commonly observed during imaging on the detector. For rectangular pixels, the energy distribution is preferentially along rows and columns, resulting in correlated noise primarily in those directions.

Inventive Scope - The general observation of possible impact of correlated noise may prove to be of benefit beyond that of the claimed invention. As an example, precautions may be taken to lessen coupling, e.g., by filtering input energy, or by increasing spacing along address lines, e.g., by addressing along diagonals. While the same manifestations will be observed in other uses, demands placed on holography for contemplated high storage densities, raise the effect to a magnitude that becomes operation-significant. The consequence of the invention will be most significant for use in holography entailing storage densities of at least 10 bits/$\mu$m$^2$.

Co-filed U.S. application Ser. No. 08/579,497 claims another procedure for decreasing net error rate. That procedure whereby run-length for same-state pixels is reduced (enabling rather than expediting) may be combined with the present invention to result in overall improvement in net BER.

The invention claimed Is:

1. Process comprising reconstruction of encoded data holographically stored in a storage medium, said process including detecting the data in the form of a 2-dimensional array of pixel rows and columns, the pixels comprising codewords constituted of codeword-common symbols, and decoding the detected data,

CHARACTERIZED IN THAT codewords of the array are 2-dimensionally dispersed so that at least some of the codeword-common symbols of a particular codeword occupy different rows and columns, and in that decoding comprises reassembly of dispersed symbols to form undispersed codewords.

2. Process of claim 1 in which all codeword-common symbols of a particular codeword occupy different rows and columns.

3. Process of claim 1 in which reassembly improves net BER of the output stream by a factor of at least 2.

4. Process of claim 3 in which stored data is stored by multiplex holography so that the storage medium contains a succession of holograms at least partially occupying the same volume of the medium.

5. Process of claim 4 in which holograms of the succession are incompletely superimposed so that they only partially occupy the same volume of the medium.

6. Process of claim 5 in which incompletely superimposed holograms are differentiated during reconstruction by Phase Correlation Multiplex Holography (PCMH).

7. Process of claim 1 in which decoding further comprises a decoding procedure for increasing average same-state pixel run-length.

8. Process comprising holographic storage to yield stored data amenable to holographic reconstruction, the process including the steps of introducing input data in the form of one dimensional bit stream, encoding the bit stream by a process including error correction coding (ECC), thereby forming codewords each comprised of data symbols and parity symbols together constituting codeword-common symbols, arraying the encoded bit stream in 2-dimensional format comprised of rows and columns, forming a display of the arrayed bit stream on a spatial light modulator (SLM), illuminating the SLM display in order to modulate the illumination and produce a signal beam, and combining the signal beam with a reference beam within a holographic medium so as to produce a hologram in the medium,

CHARACTERIZED IN THAT the process further comprises an additional encoding procedure for 2-dimensionally dispersing codewords so that some codeword-common symbols of a particular codeword occupy different rows and columns on the SLM.

9. Process of claim 8 in which all codeword-common symbols of a particular codeword occupy different rows and columns on the SLM.

10. Process of claim 9 in which stored data is stored by multiplex holography so that the storage medium contains a succession of holograms at least partially occupying the same volume of the medium.

11. Process of claim 10 in which holograms of the succession are incompletely superimposed so that they only partially occupy the same volume of the medium.

12. Process of claim 11 in which incompletely superimposed holograms are differentiated during reconstruction by Phase Correlation Multiplex Holography (PCMH).

13. Process of claim 8 including reconstruction of stored data to yield an output data stream, the process including decoding of detected data to accommodate encoding.

14. Process of claim 8 wherein arrayed data is encoded to reduce average run-length of same-state pixels.

* * * * *